US008011762B2

(12) United States Patent
Komatsu et al.

(10) Patent No.: US 8,011,762 B2

(45) Date of Patent: Sep. 6, 2011

(54) DROPLET DISCHARGING HEAD AND METHOD OF MANUFACTURING THE SAME, AND DROPLET DISCHARGING DEVICE AND METHOD OF MANUFACTURING THE SAME

(75) Inventors: Hiroshi Komatsu, Shimosuwa-machi (JP); Tomoki Sakashita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 771 days.

(21) Appl. No.: 11/865,599

(22) Filed: Oct. 1, 2007

(65) Prior Publication Data

US 2008/0180489 A1 Jul. 31, 2008

(30) Foreign Application Priority Data

Oct. 2, 2006 (JP) ................................ 2006-271137

(51) Int. Cl.

*B41J 2/045* (2006.01)
*B41J 2/14* (2006.01)
*H01L 21/00* (2006.01)

(52) U.S. Cl. .............................. 347/70; 347/50; 438/21

(58) Field of Classification Search ........................ None
See application file for complete search history.

(56) References Cited

U.S. PATENT DOCUMENTS 6,274,919 B1 * 8/2001 Wada ........................... 257/508
7,658,471 B2 2/2010 Matsuno et al.
2010/0128076 A1 5/2010 Matsuno et al.

FOREIGN PATENT DOCUMENTS

JP 2001-063072 3/2001
JP 2002-144585 5/2002
JP 2003-019804 1/2003
JP 2006-224564 8/2006
JP 2006-256224 9/2006

OTHER PUBLICATIONS

Partial English Translation of JP 2006-256224 Patent Application, (Otani, Kazufumi) Sep. 28, 2006, [online], [retrieved on Aug. 9, 2010] Retrieved from the Industrial Propery Digital Libray of the Japan Patent Office using Internet <URL: http://www.ipdl.inpit.go.jp/homepg_e.ipdl/>.*

* cited by examiner

*Primary Examiner* — Omar Rojas

(74) *Attorney, Agent, or Firm* — Workman Nydegger

(57) ABSTRACT

A droplet discharging head comprises: a cavity substrate including a discharge chamber having a bottom wall serving as a vibration plate; and an electrode substrate including an individual electrode that faces the vibration plate with a gap and drives the vibration plate, and a driver integrated circuit (IC) that couples with the individual electrode and applies a voltage to the individual electrode. The cavity substrate includes a first opening that penetrates the cavity substrate and serves to house the driver IC, and an insulation film formed on a wall face of the first opening.

10 Claims, 7 Drawing Sheets

DROPLET DISCHARGING HEAD AND METHOD OF MANUFACTURING THE SAME, AND DROPLET DISCHARGING DEVICE AND METHOD OF MANUFACTURING THE SAME

BACKGROUND

1. Technical Field

The present invention relates to a droplet discharging head and a droplet discharging device both of which discharge ink or liquid and a method for manufacturing the same, and more particularly to a compact stable droplet discharging head and a device without having electrical failures and a method for manufacturing the same.

2. Related Art

As a device for discharging a droplet, an inkjet head built in an inkjet recording device is known. Generally, the inkjet head is provided with a nozzle substrate having a plurality of nozzle holes for discharging an ink droplet, and a cavity substrate that has a discharge chamber bonded to the nozzle substrate so as to communicate with the nozzle hole and an ink flow path such as a reservoir. The inkjet head discharges an ink droplet from a selected nozzle hole by applying pressure to the discharge chamber. Examples of methods for discharging an ink droplet include an electrostatic driving method using electrostatic force, a piezoelectric method using piezoelectric elements, and a bubble jet (registered trade mark) method using heater elements.

The inkjet head employing the electrostatic driving method is provided with a cavity substrate in which the bottom of a discharge chamber serves as a vibration plate and an electrode substrate that is bonded to the cavity substrate and has an individual electrode facing the vibration plate with a predetermined gap. For discharging an ink droplet, an applied driving voltage charges the individual electrode positively and the vibration plate negatively. The applied voltage produces electrostatic force to elastically deform the vibration plate toward the individual electrode. Upon turning off the driving voltage, the vibration plate is restored. This restoring movement rapidly increases the pressure inside the discharge chamber, thereby discharging a portion of ink in the discharge chamber from the nozzle hole as an ink droplet.

In recent years, in the inkjet head employing the electrostatic driving method, highly densified and multi-rowed nozzles have been developed for high-speed and multi-color printing high-resolution images. Along with this development, the number of nozzles and discharge chambers per row has increased and the length of nozzle rows has been elongated. As a result, the number of actuators inside the inkjet head has been more and more increased. On the other hand, a structure has been proposed in which an IC for controlling actuators is built in the inkjet head for downsizing the inkjet head.

, JP-A-2001-63072 discloses an inkjet head as one of such examples (page 5 and FIG. 1.) The inkjet head includes single or multiple nozzles discharging an ink droplet, a discharge chamber communicating with each nozzle hole, a vibration plate serving as at least one wall of the discharge chamber, driving means for causing the vibration plate to be deformed and an individual electrode by which the driving means deforms the vibration plate with electrostatic force. In addition, a first substrate in which the vibration plate is formed is a single-crystalline substrate and a second substrate in which the individual electrode is formed is a glass substrate. A method for manufacturing the inkjet head includes the following steps. As means for maintaining a gap between the vibration plate and the individual electrode, either a gap spacer made of a $SiO_2$ film is formed to the first substrate or a recess is formed to the second substrate. Next, the vibration plate and the individual electrode are faced and anodic bonded. Then, the vibration plate is etched to a determined thickness. This etching step includes two steps: a region (a contact area) of the first substrate is simultaneously etched to the same thickness as that of the vibration plate when the vibration plate is etched where the region is larger than the area, facing the region, of a terminal part for supplying voltage to the individual electrode (external electrode for the individual electrode) on the second substrate; and then silicon remaining in the contact area is dry etched to form a thorough hole. Additionally, an etching cover film is formed on the external electrode for the individual electrode facing the contact area. The etching cover film withstands silicon dry etching and can be selectively removed with respect to the electrode.

In the disclosed inkjet head, the insulation film having high insulation property and sufficient etching resistance is formed on the individual electrode as the etching cover film to prevent the electrode from being damaged by etching the through hole and leak current between electrodes. The inkjet head, however, needs to form the etching cover film on the substrate on which the individual electrode has been wired, to perform a patterning and to remove the used etching cover film. As a result, the number of manufacturing steps increases. In addition, only limited materials are usable. That is, some materials cannot be processed.

As a countermeasure, the insulation film may be formed after opening a portion of the silicon substrate by dry etching. However, this method also needs to remove the formed insulation film, so that a new problem arises. That is, when removing the formed insulation film, it is very difficult to remove the insulation film only formed on a part corresponding to a driver IC mount area and an FPC mount area while the insulation film remains that is formed on a wall face of the opening of the silicon substrate.

SUMMARY

An advantage of the invention is to provide a droplet discharging head and a droplet discharging device that effectively prevent electrical failures without having a complicated structure, and a method for manufacturing the same.

According to a first aspect of the invention, a droplet discharging head includes a cavity substrate including a discharge chamber having a bottom wall serving as a vibration plate, and an electrode substrate. The electrode substrate includes an individual electrode that faces the vibration plate with a gap and drives the vibration plate, and a driver integrated circuit (IC) that couples with the individual electrode and applies a voltage to the individual electrode. The cavity substrate includes a first opening that penetrates the cavity substrate and serves to house the driver IC, and an insulation film formed on a wall face of the first opening.

The head eliminates a part (particularly, the wall face of the first opening) in which silicon is exposed from the cavity substrate, thereby preventing electrical shorts between an input wiring line of the electrode substrate and silicon of the cavity substrate. That is, the head can effectively prevent electrical failures without having a complicated structure. In addition, the input wiring line is free from being damaged since electrical shorts do not occur between the input wiring line and silicon.

In this case, the electrode substrate may include a flexible printed circuit (FPC) mount area on which a flexible printed board to supply a signal for driving the individual electrode, and the cavity substrate may include a second opening corresponding to the FPC mount area and the insulation film formed on a wall face of the second opening. The head eliminates a part (particularly the wall face of the second opening) in which silicon is exposed from the cavity substrate, thereby preventing electrical shorts between an input wiring line of the electrode substrate and silicon of the cavity substrate.

In this case, the cavity substrate may include a sealing hole sealed with a sealant to form a sealing part for shielding the gap from ambient air and the insulation film formed on a wall face of the sealing hole. The head eliminates a part (particularly the wall face of the sealing hole) in which silicon is exposed from the cavity substrate, thereby preventing electrical shorts between an input wiring line of the electrode substrate and silicon of the cavity substrate.

In this case, the insulation film may be a silicon oxide film. That is, the head can effectively prevent electrical failures without the insulation film having a special structure.

According to a second aspect of the invention, a droplet discharging device includes the droplet discharging head according to the first aspect of the invention. The device has all advantageous effects of the droplet discharging head.

According to a third aspect of the invention, a method for manufacturing a droplet discharging head includes: forming a first recess and a second recess on a surface of a silicon substrate; forming an insulation film on the surface; anodic bonding the silicon substrate to an electrode substrate; and forming a liquid flow path to the silicon substrate. The silicon substrate includes a discharge chamber having a bottom wall serving as a vibration plate and the liquid flow path communicating with the discharge chamber. The electrode substrate includes an individual electrode that faces the vibration plate with a gap and drives the vibration plate. The first recess houses a driver integrated circuit (IC) that is mounted on the electrode substrate and couples to the individual electrode and supplies a voltage to the individual electrode. The second recess corresponds to a flexible printed circuit (FPC) mount area that is formed on the electrode substrate and on which a flexible printed board is mounted to supply a signal for driving the individual electrode.

The head eliminates a part (particularly, the wall face of the first recess and the wall face of the second recess) in which silicon is exposed from the cavity substrate, thereby preventing electrical shorts between an input wiring line of the electrode substrate and silicon of the cavity substrate. That is, the head can effectively prevent electrical failures without having a complicated structure. In addition, the input wiring line is free from being damaged since electrical shorts do not occur between the input wiring line and silicon.

In this case, the method may further include, after anodic bonding the silicon substrate and the electrode substrate, forming a sealing hole for being sealed with a sealant to form a sealing part shielding the gap from ambient air. The method allows the gap to be firmly sealed since the gap can be sealed in prior to form the liquid flow path. In addition, labor hours and costs for manufacturing can be reduced since the head can be manufactured without special tools.

In this case, the method may further include sealing the sealing hole and thereafter polishing the silicon substrate to a predetermined thickness to form the first and second recesses as through holes. Since the gap is firmly sealed, water used in grinding and polishing the silicon substrate never breaks in the gap. Therefore, a droplet discharging head can be manufactured that has an excellent discharging performance and high reliability.

In this case, the method may further include, after forming the first and second recesses as through holes and before forming the liquid flow path, forming an insulation film on a surface of the silicon substrate. Then the liquid flow path is formed to the silicon substrate. The method allows the gap to be firmly sealed since the gap can be sealed in prior to form the liquid flow path on the silicon substrate. In addition, labor hours and costs for manufacturing can be reduced since the head can be manufactured without special tools.

According the a fourth aspect of the invention, a method for manufacturing a droplet discharging device includes the method for manufacturing a droplet discharging head according to the third aspect of the invention. The method has all advantageous effects of the method for manufacturing a droplet discharging head.

BRIEF DESCRIPTION OF THE DRAWINGS

The invention will be described with reference to the accompanying drawings, wherein like numerals reference like elements.

DESCRIPTION OF EXEMPLARY EMBODIMENTS

An embodiment of the present invention will now be described below with reference to the accompanying drawings.

Figure 1:
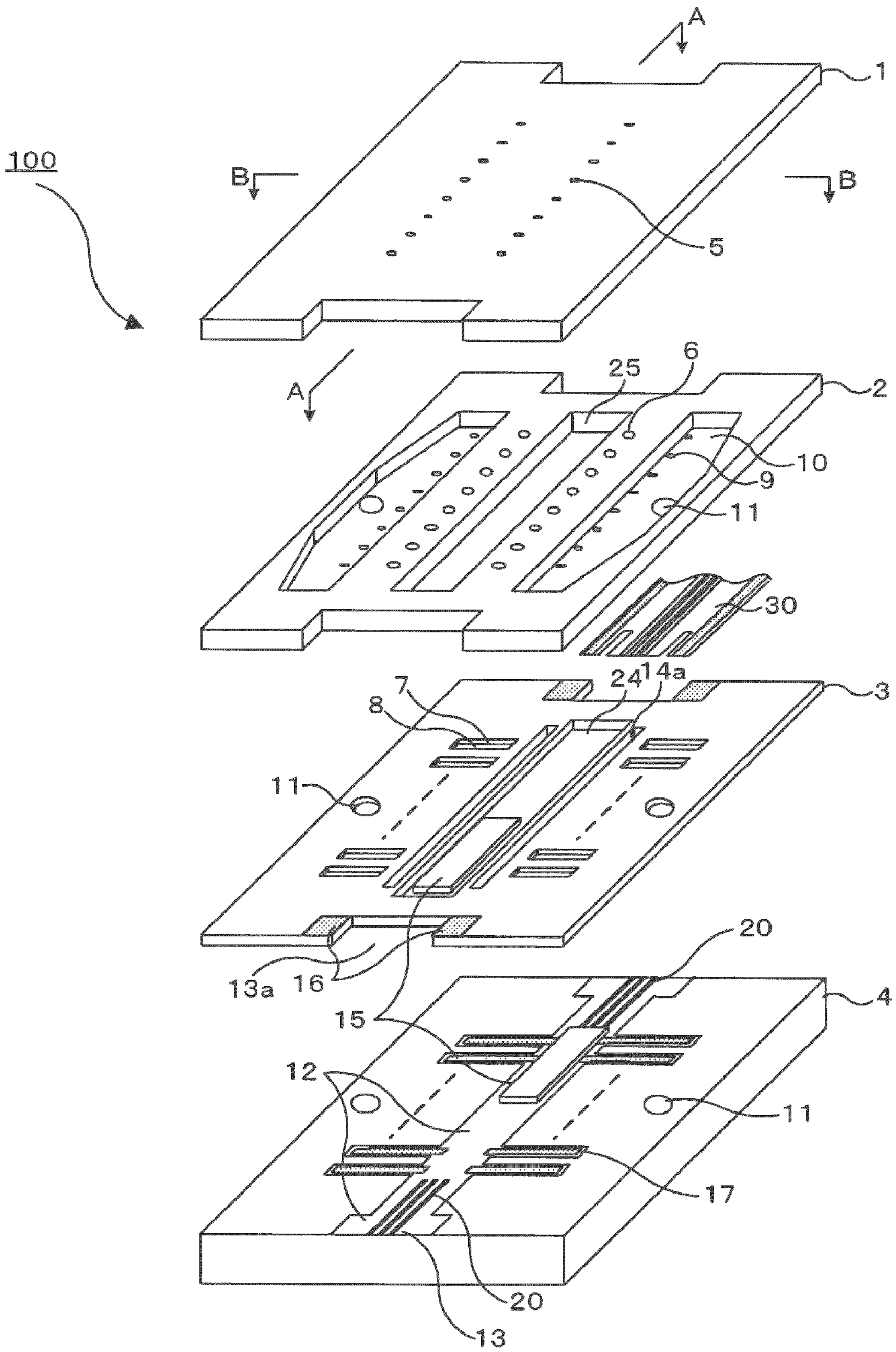
FIG. 1 is an exploded perspective view of a droplet discharging head according to an embodiment of the present invention.

FIG. 1 is an exploded perspective view of a droplet discharging head 100 according to the embodiment of the invention. The structure of the droplet discharging head 100 will be described with reference to FIG. 1. FIG. 1 also shows part of a flexible printed circuit (FPC) 30 for supplying a driving signal to a driver IC 15.

The droplet discharging head 100 shows a face-eject type droplet discharge head as a representative example of electrostatic actuators driven by electrostatic force. The face-eject type head discharges a droplet from a nozzle hole disposed on the surface of a nozzle substrate. Note that the relation between constitutional elements may be different from that between actual ones in the following drawings and FIG. 1. In the drawings, the topside is described as up, and the bottom side is described as down.

As shown in FIG. 1, the droplet discharging head 100 has a four-layer structure, in which an electrode substrate 4, a cavity substrate 3, reservoir substrate 2 and a nozzle substrate 1 are layered and bonded in this order. On one surface (upper surface) of the reservoir substrate 2, bonded is the nozzle substrate 1 while on the other surface (under surface) of the reservoir substrate 2, bonded is the cavity substrate 3. On the surface, opposite to the surface on which the reservoir substrate 2 is bonded, of the cavity substrate 3, bonded is the electrode substrate 4. That is, the electrode substrate 4, the cavity substrate 3, the reservoir substrate 2, and the nozzle substrate 1 are bonded in this order. The droplet discharging head 100 also includes a driver IC 15 supplying a driving signal to an individual electrode 17.

Electrode Substrate 4

The electrode substrate 4, for example, may be formed by using glass such as borosilicate glass having a thickness of 1 mm as a major material. While a case is exemplarily shown in which the electrode substrate 4 is formed by borosilicate glass, but the electrode substrate 4 may be formed by single-crystalline silicon. On the surface of the electrode substrate 4, formed is a recess (glass groove) 12 formed so as to coincide with the shape of a discharge chamber 7 of the cavity substrate 3, which will be described later. The recess 12 may be formed with a depth of 0.3 μm by etching, for example.

Inside the recess 12 (particularly, on the bottom of), formed is the individual electrode 17. The individual electrode 17, which serves as a fixed electrode, is formed in a plurality of numbers with a constant interval so that each individual electrode 17 faces each discharge chamber 7 (a vibration plate 8) of the cavity substrate 3, which will be described later. The recess 12 is patterned to have a shape similar to and slightly larger than that of the individual electrode 17 so as to house the individual electrode 17. The individual electrode 17 may be formed to have a thickness of 0.1 μm by sputtering indium tin oxide (ITO).

The individual electrode 17 made of ITO as described above has an advantage in that whether a discharge occurs or not is easily confirmed since it is transparent. The individual electrode 17, one end of which (adjacent to the center of the electrode substrate 4) is connected to the driver IC 15, receives a driving signal from the driver IC 15. The driver IC 15 is mounted in the recess 12, which is located between two electrode rows composed of the individual electrode 17 (i.e., at the central part of the electrode substrate 4), and is coupled to the both electrode rows. This structure allows the driver IC 15 to supply a driving signal to both electrode rows, making it easy to provide the electrode row in a plurality of numbers.

In the recess 12 of the electrode substrate 4, formed is an FPC mounted area 13 to which an FPC 30 is mounted. On the FPC mounted area 13, formed is an input wiring line 20 for supplying an input signal to drive the driver IC 15. The input wiring line 20 connects the FPC 30 and the driver IC 15. In addition, a sealing part 14 may be formed that serves to seal a gap 18, which is a predetermined air gap formed between the electrode substrate 4 and the cavity substrate 3 after bonding the electrode substrate 4 and the cavity substrate 3. In this embodiment, the droplet discharging head 100 includes two driver ICs 15. The number of driver ICs 15, however, is not limited to two.

When the electrode substrate 4 and the cavity substrate 3 are bonded to form a layered body, the gap (air gap) 18 having a predetermined clearance is formed between the vibration plate 8 and the individual electrode 17 due to the recess 12 of the electrode substrate 4. The gap 18 allows the vibration plate 8 to bend (displace) inside. The gap 18 may be formed with a depth of 0.2 μm, for example. The gap 18 is determined by the depth of the recess 12, and the thicknesses of the individual electrode 17 and the vibration plate 8. The gap needs to be strictly controlled in accuracy since it largely influences to discharging characteristics of the droplet discharging head 100. The vibration plate 8 functions as an actuator since it is driven by electrostatic force.

Each gap 18 is formed so as to have an elongated shape with a predetermined depth at a position facing each vibration plate 8. The gap 18 can be provided by forming a recess or placing a spacer on a silicon substrate serving as the cavity substrate 3, other than forming the recess 12 on the electrode substrate 4. Each individual electrode 17 faces each vibration plate 8 with a constant clearance and extends toward the central part of the electrode substrate 4 along the bottom surface of each gap 18. At the central part, it is connected to the driver IC 15.

In the droplet discharging head 100, a plurality of individual electrodes 17, each of which is formed in a rectangular shape having long and short sides, is disposed so that each long side is in parallel with each other. In FIG. 1, the electrode row extending in the short side direction of the individual electrode 17 is exemplarily shown. In this regard, when the individual electrode 17 is formed in a parallelogram shape, in which the short side is formed oblique to the long side, an electrode row may be formed that extends in a direction perpendicular to the long side direction.

The electrode substrate 4 also includes an ink supply hole 11, which serves as a flow path to introduce a liquid supplied from an external tank (not shown). The ink supply hole 11 penetrates the electrode substrate 4. In the embodiment, the individual electrode 17 is made of ITO. However, the material is not limited to ITO, metal such as chromium may be used. The depth of the recess 12, the length of the gap 18, and the thickness of the individual electrode 17 are exemplarily described above. The values are not limited to those described above.

Cavity Substrate 3

The cavity substrate 3 is made of a single-crystalline silicon substrate (hereinafter, simply referred to as a silicon substrate) as a major material. The substrate has a thickness of about 50 μm and a surface orientation (110), for example. The silicon substrate is either dry etched or anisotropic wet etched or both thereof to form a plurality of discharge chambers (or pressure chambers) 7, each of which includes the bottom wall that has flexibility and serves as the vibration plate 8. The discharge chamber 7, which is formed to correspond the individual electrode 17 in the electrode rows, holds a droplet such as ink, and to which discharge pressure is applied.

Each discharge chamber 7 is also formed so as to be in parallel with each other from the front side to the back side as shown in FIG. 1. At the central part of the cavity substrate 3, formed is a through hole 24, which corresponds to the shape of the recess 12 and serves as a first opening. At a part, which corresponds to the FPC mount area 13 formed on the electrode substrate 4, of the cavity substrate 3, formed is a second recess 13*a*, which corresponds to the shape of the FPC mount area 13 and serves as a second opening.

In addition, on the under surface (facing the electrode substrate 4) of the cavity substrate 3, formed is an $SiO_2$ film 83 (shown in FIG. 5D) as a film having a thickness of 0.1 μm by plasma chemical vapor deposition (CVD) or TEOS-pCVD. The $SiO_2$ film 83 electrically insulates the vibration plate 8 and the individual electrode 17 and is a TEOS film, which is an insulation film, made of tetraethyl orthosilicate tetraethoxysilane. This film serves to prevent the occurrence of insulation breakdowns and short circuits when the vibration plate 8 is driven, and the cavity substrate 3 from being etched by a droplet such as ink.

The $SiO_2$ film 83 is exemplarily shown as the TEOS film in the embodiment. The material is, however, not limited to TEOS, but any materials may be used as long as they improve insulation property. For example, aluminum oxide—alumina—($Al_2O_3$) may be used. In this regard, an $SiO_2$ film including the TEOS film may be formed on the upper surface of the cavity substrate 3 as an ink protective film 86 (shown in FIG. 6E) by plasma CVD or sputtering. Forming the ink protective film 86 can prevent flow paths from being eroded by an ink droplet. This structure also has an advantageous effect of reducing the warp of the vibration plate 8 by balancing the stresses of the ink protective film 86 and the $SiO_2$ film 83.

In the embodiment, the $SiO_2$ film 83 covers the upper and under surfaces of the cavity substrate 3, a wall surface of the through hole 24, a wall surface of the second recess 13*a*, which corresponds to the FPC mount area 13 of the electrode substrate 4 and serves as the second opening, and a wall surface of a sealing hole 14*a* serving to form the sealing part 14. The covered film eliminates any part in which silicon is exposed from the cavity substrate 3, preventing short circuits from occurring between the exposed silicon and the input wiring line 20 formed on the electrode substrate 4. As a result, the input wiring line 20 is prevented from being broken down.

The vibration plate 8 may be formed as a highly doped boron layer. When single-crystalline silicon is etched by an alkali solution such as a solution of potassium hydroxide (KOH), the etching rate becomes extremely low in a highly doped boron region having a dopant concentration of about $5\times10^{19}$ atoms/$cm^3$ or more. Therefore, the vibration plate 8 can be formed to a desired thickness by using a so-called etching-stop technique, in which an etching rate becomes extremely low due to the exposure of a boron doped layer, when the discharge chamber 7 is formed by anisotropic etching with an alkali solution after the part corresponding to the vibration plate 8 is made as a highly boron doped layer.

The cavity substrate 3 also includes the ink supply hole 11, which communicates with the ink supply hole 11 provided to the electrode substrate 4. The cavity substrate 3 further includes a common electrode terminal 16 as an external electrode terminal. The external electrode terminal 16 serves as a terminal when electric charges having a polarity opposite to that of the individual electrode 17 is supplied to the vibration plate 8 from an external oscillation circuit (not shown) or the like.

Reservoir Substrate 2

The reservoir substrate 2, which is made of mainly single-crystalline silicon, includes a reservoir 10 that supplies a droplet such as ink to each discharge chamber 7 and is formed in common to each discharge chamber 7. The bottom of the reservoir 10 has supply inlets 9, each of which is formed so as to coincide with the position of each discharge chamber 7 and transfers a droplet to the discharge chamber 7 from the reservoir 10. The bottom of the reservoir 10 also has the ink supply hole 11 penetrating the same.

Each ink supply hole 11 included in the reservoir substrate 2, in the cavity substrate 3, and in the electrode substrate 4 is designed for communicating with each other and introducing a droplet supplied from an external ink tank when the reservoir substrate 2, the cavity substrate 3, and the electrode substrate 4 are bonded. In addition, a plurality of nozzle communication holes 6 is formed so that each nozzle communication hole 6 corresponds to each nozzle hole 5. Each nozzle communication hole 6 serves as a flow path between each discharge chamber 7 and each nozzle hole 5. Ink droplets pressurized in the discharge chamber 7 are transferred through the nozzle communication hole 6 to the nozzle hole 5. At the central part of the reservoir substrate 2, formed is a through hole 25, which corresponds to the shape of the through hole 24.

Nozzle Substrate 1

The nozzle substrate 1, which is exemplarily made by mainly using a silicon substrate having a thickness of 100 μm, includes the nozzle holes 5, each of which communicates with each nozzle communication hole 6. Each nozzle hole 5 serves to discharge a droplet transported from each nozzle communication hole 6 to an outside. If the nozzle hole 5 is structured with a plurality of steps, improving droplet straight flying property can be expected when a droplet is discharged. Although it is described that the nozzle substrate 1 having the nozzle hole 5 is located on an electrode substrate 4, the nozzle substrate 1 is mostly located under the electrode substrate 4 in actual use.

When the electrode substrate 4, the cavity substrate 3, the reservoir substrate 2 and the nozzle substrate 1 are bonded, anodic bonding is employed for bonding a substrate made of borosilicate glass and another substrate made of silicon (in a case where the electrode substrate 4 and the cavity substrate 3 are bonded) while direct bonding is employed for bonding substrates made of silicon (in a case where the cavity substrate 3 and the reservoir substrate 2 are bonded, and in another case where the reservoir substrate 2 and the nozzle substrate 1 are bonded). Bonding substrates made of silicon can also be achieved by using an adhesive.

Figure 2:
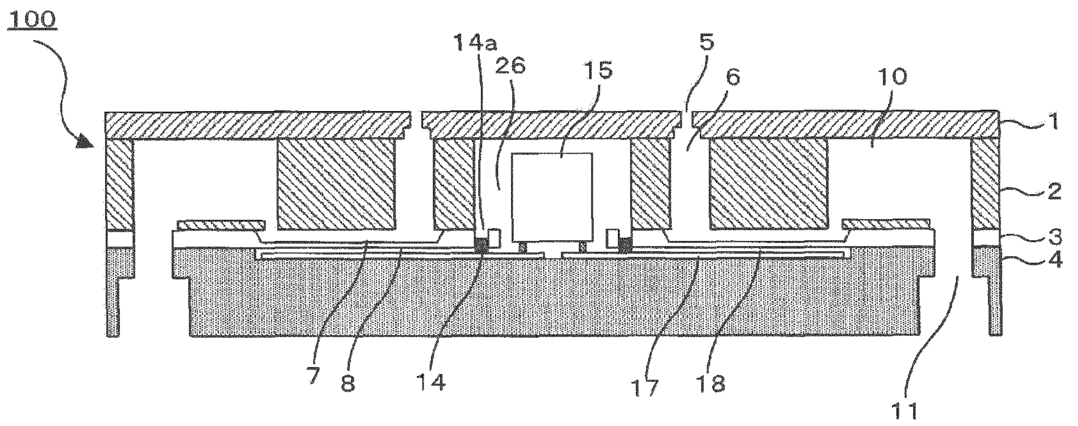
FIG. 2 is a longitudinal sectional-view illustrating the sectional structure of the droplet discharging head.

FIG. 2 is a longitudinal sectional view illustrating the sectional structure of the droplet discharging head 100. This longitudinal sectional view illustrates a section taking along the line B-B of the droplet discharging head 100 in an assembled state (refer to FIG. 1). The structure and operation of the droplet discharging head 100 in the assembled state will be described with reference to FIG. 2. As shown in FIG. 2, the droplet discharging head 100 has the through hole 24 at the central part of the cavity substrate 3 in order to expose the end part of each individual electrode 17 of the electrode substrate 4 bonded to the cavity substrate 3. In the through hole 24, mounted is the driver IC 15.

The driver IC 15 serving as power (electric charge) supply means to the individual electrode 17 is connected to each individual electrode 17 to supply electric charges to the individual electrode 17 selected, in the through hole 24. That is, the driver IC 15 is housed inside the droplet discharging head 100. The driver IC 15 is closed by being surrounded with the nozzle substrate 1 as an upper surface, the reservoir substrate 2 and the cavity substrate 3 as a side surface, and the electrode substrate 4 as an under surface. The through hole 24 of the cavity substrate 3 and the through hole 25 of the reservoir substrate 2 form a storing space 26, in which the driver IC 15 is housed. The storing space 26 is preferably sealed in order to protect the driver IC 15 from droplets and ambient air.

The sealing part 14 is formed to a side adjacent to the through hole 24 to seal the gap 18 formed when the electrode substrate 4 and the cavity electrode 3 are bonded. That is, a sealing hole 14*a* shown in FIG. 1 is sealed to form the sealing part 14. As a result, the gap 18 can be air tightly sealed. Materials used for the sealing part 14 are not particularly limited. Any material can be used as long as it can air tightly seal the gap 18. For example, silicon oxide ($SiO_2$) having low moisture transmitting property, aluminum oxide ($Al_2O_3$), silicon oxy-nitride (SiON), silicon nitride (SiN), and poly-para-xylylene may be used for sealing the sealing part 14.

Next, the operation of the droplet discharging head 100 will be briefed. The reservoir 10 receives droplets such as ink supplied from an outside through the ink supply hole 11. The droplets are supplied to the discharge chamber 7 from the reservoir 10 through the supply inlet 9. The driver IC 15 receives a driving signal (pulse voltage) supplied from a controller (not shown) of a droplet discharging device through the FPC 30. A pulse voltage of about 0 V to 40 V is applied to the individual electrode 17 selected by the driver IC 15 to charge the individual electrode 17 positive.

At this time, electric charges having a negative polarity is supplied to the cavity substrate 3 from an external oscillation circuit or the like through the common electrode terminal 16 to charge the vibration plate 8 negative, corresponding to positive charges in the individual electrode 17. Thus, electrostatic force occurs between the vibration plate 8 and the individual electrode 17 selected. The vibration plate 8 is warped by electrostatic force pulling the vibration plate 8 toward the side adjacent to the individual electrode 17. This warp increases the volume of the discharge chamber 7.

Then, upon stopping supplying the pulse voltage to the individual electrode 17, electrostatic force disappears that has been generated between the vibration plate 8 and the individual electrode 17, whereby the vibration plate 8 is restored to the original state. Simultaneously, pressure inside the discharge chamber 7 so rapidly increases that a droplet inside the discharge chamber 7 passes through the nozzle communication hole 6 to be discharged from the nozzle hole 5. With the discharged droplet landed on recording paper, a printing is done, for example. Then, a droplet is resupplied inside the discharge chamber 7 from the reservoir 10 through the supply inlet 9. As a result, the discharge chamber 7 is restored to an initial condition. Such method is called a drawing shot. There is another method called a pushing shot discharging a droplet by using a spring or the like.

A droplet is supplied to the reservoir 10 of the droplet discharging head 100 from a droplet supply tube (not shown) connected to the ink supply hole 11, for example. The FPC 30 is connected to the driver IC 15 so that the longitudinal direction of the FPC 30 is in parallel with the short side direction of the individual electrode 17 included in the electrode rows. In this regard, when the individual electrode 17 is formed in a parallelogram shape, in which the short side is formed oblique to the long side, the FPC 30 may be connected in a direction perpendicular to the long side direction of the individual electrode 17. This structure allows the droplet discharging head 100 including the electrode rows and the FPC 30 to be compactly connected.

Figure 3:
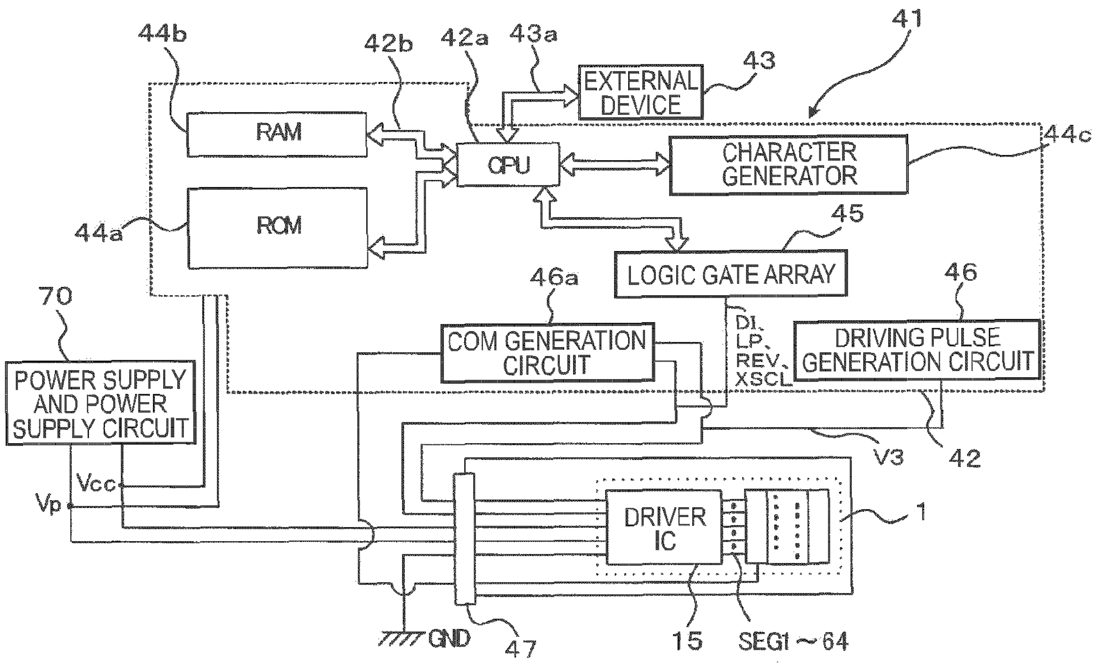
FIG. 3 is a schematic block diagram illustrating a control system of a droplet discharging device provided with the droplet discharging head.

FIG. 3 is a schematic block diagram illustrating a control system of a droplet discharging device provided with the droplet discharging head 100. A case is exemplified in which the droplet discharging device is a typical inkjet printer. The control system of the droplet discharging device provided with the droplet discharging head 100 will be described with reference to FIG. 3. Note that the control system of the droplet discharging device provided with the droplet discharging head 100 is not limited to that described hereinafter.

The inkjet printer is provided with a driving controller 41 for driving and controlling the droplet discharging head 100. The driving controller 41 includes a controller 42 provided with a central processing unit (CPU) 42*a* as a major part. The CPU 42*a* receives printing information from an external device 43 such as a personal computer and a remote controller. The printing information is input through a bus 52 or as a wireless signal such as an infrared signal. The CPU 42*a* is connected to a ROM 44*a*, a RAM 44*b*, and a character generator 44*c* through an internal bus 53.

The controller 42 executes a control program stored in the ROM 44*a* by using a storage area in the RAM 44*b* as a working area to produce a control signal for driving the droplet discharging head 100 based on character information generated from the character generator 44*c*. The control signal is passed through a logic gate array 45 and a driving pulse generating circuit 46 so as to be converted into a driving control signal corresponding to the printing information. Then, the driving control signal is supplied to the driver IC 15 included in the droplet discharging head 100 through a connector 47, and to a COM generating circuit 46*a*. The driver IC 15 also receives a driving pulse signal V3 for printing, a control signal LP, a polarity inversion control signal REV, and the like (refer to FIG. 4). The COM generating circuit 46*a* may be structured with a common electrode IC (not shown) for generating a driving pulse, for example.

The COM generating circuit 46*a* outputs a driving signal (driving voltage pulse), which is applied to the common electrode terminal 16, i.e., each vibration plate 8, of the droplet discharging head 100, from a common output terminal COM (not shown) based on the above supplied signals. The driver IC 15 outputs a driving signal (driving voltage pulse) to be supplied to each individual electrode 17 from individual output terminals SEG, provided with the number equal to that of individual electrodes 17, based on the above supplied signals and a driving voltage Vp supplied from a power supply circuit 70. The potential difference between the outputs of the common output terminal COM and the individual output terminal SEG is applied between each vibration plate 8 and each individual electrode 17 facing each other. A driving potential difference waveform having a designated direction is given when the vibration plate 8 is driven (discharging a droplet) while no driving potential difference is given when the vibration plate 8 is not driven.

Figure 4:
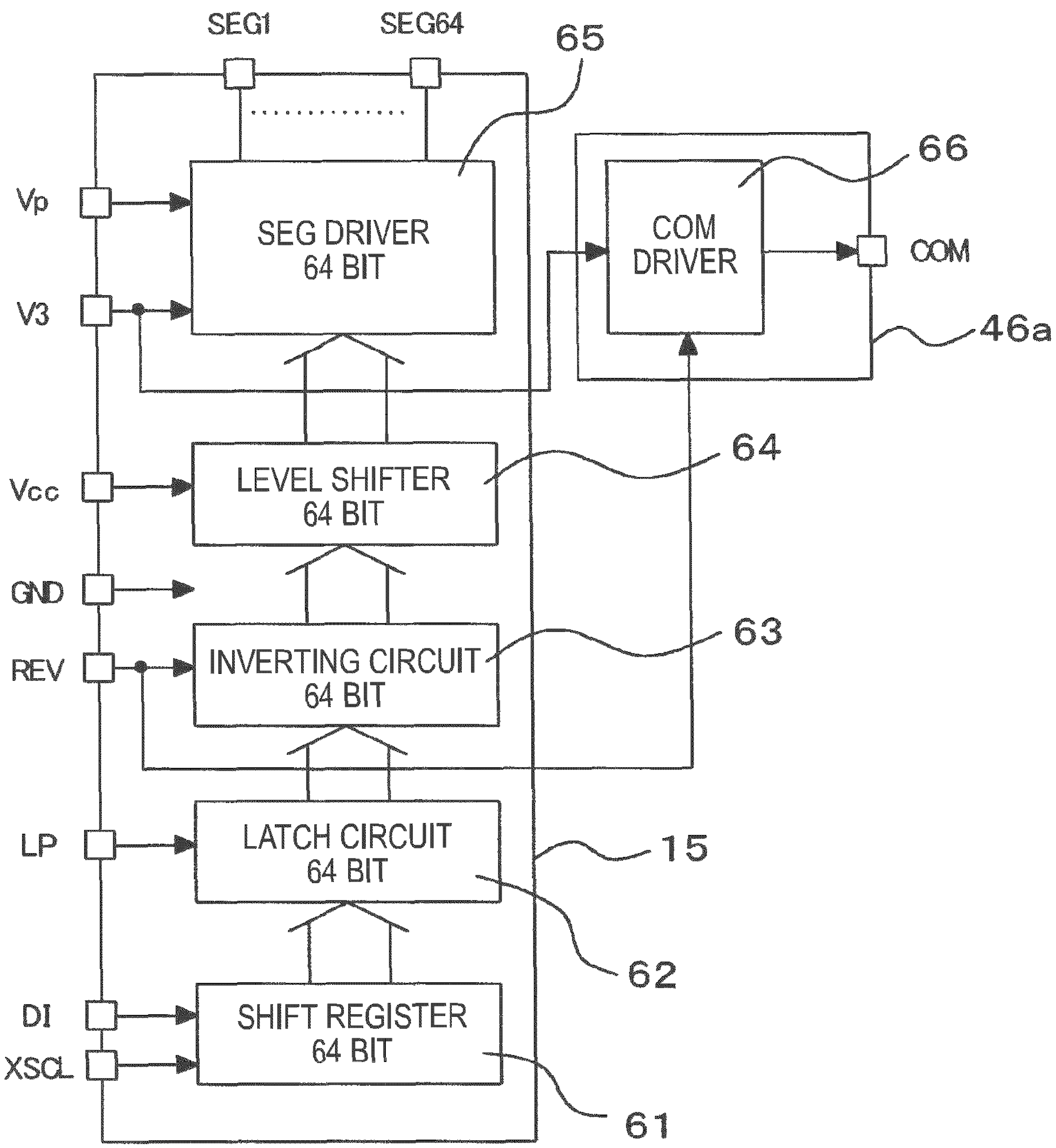
FIG. 4 is a schematic block diagram illustrating an example of the internal structure of a driver IC and a COM generating circuit.

FIG. 4 is a schematic block diagram illustrating an example of the internal structure of the driver IC 15 and the COM generating circuit 46*a*. A pair of the driver IC 15 and the COM generating circuit 46*a* supplies a driving signal to 64 individual electrodes 17 and vibration plates 8. FIG. 4 shows a case in which the driver IC 15 is a high breakdown voltage CMOS driver that operates and outputs 64-bit data by receiving the driving voltage Vp having a high voltage and a logic circuit driving voltage Vcc that are supplied from the power supply circuit 70.

The driver IC 15 applies either the driving voltage pulse or the ground (GND) potential to the individual electrode 17 based on a supplied driving control signal. The driver IC 15 includes a 64-bit shift register 61. The shift register 61 is a static shift register, which shifts up a 64-bit DI signal sent from the logic gate array 45 as serial date based on an XSCL pulse signal, which is a basic clock synchronizing with the DI signal, to store date into a register inside the shift register 61. The DI signal is a control signal that shows selection information for selecting each of 64 individual electrodes 17 as an on/off manner, and is sent as serial data.

The driver IC 15 also includes a 64-bit latch circuit 62. The latch circuit 62 is a static latch, which latches 64-bit data stored in the shift register 61 base on a control signal (latch pulse) LP to store the data, and outputs the stored data to an inverting circuit 63 as a signal. In the latch circuit 62, the DI signal of serial data is converted into a 64-bit parallel signal for outputting a 64-segment-output to drive each vibration plate 8.

The inverting circuit 63 outputs the exclusive OR of the signal input from the latch circuit 62 and the REV signal to a level shifter 64. The level shifter 64 is a level interface circuit, which converts the voltage level of the signal input from the inverting circuit 63 from a logic voltage level (5V or 3.3V) to a head driving voltage level (0V to 45V). An SEG driver 65, which includes a 64-channel transmission gate output, outputs either a driving voltage pulse input or a GND input to segment outputs SEG 1 to 64, based on the input of the level shifter 64. A COM driver 66 included in the COM generating circuit 46*a* outputs either a driving voltage pulse or the GND input based on the REV input.

Each of XSCL, DI, LP, and REV signals has the logic voltage level and is sent to the driver IC 15 from the logic gate array 45. Since the driver IC 15 and the COM generating circuit 46*a* are structured as described above, the driving voltage pulse and the GND potential, which drive the vibration plate 8 of the liquid discharging head 100, can easily be switched even if the number of driving segments (vibration plates 8) is increased.

The above signals are supplied to the driver IC 15 through the input wiring line 20 formed on the electrode substrate 4. If the cavity substrate 3 includes a part in which silicon is exposed, an electrical short may occur between the input wiring line 20 and the cavity substrate 3 to break down the input wiring line 20. Likewise, an electrical short may occur between the individual electrode 17, to which a signal is supplied from the driver IC 15, and the cavity substrate 3 to break down the individual electrode 17. These setbacks are likely to lower stability and reliability. Consequently, any part in which silicon is exposed is eliminated from the cavity substrate 3 to prevent the input wiring line 20 and the individual electrode 17 from being broken down in this embodiment.

A manufacturing step of the droplet discharging head 100 will be described below. FIGS. 5A to 6E are sectional views illustrating an exemplary manufacturing step of the cavity substrate 3, which is a distinctive part of the embodiment. The manufacturing step of the cavity substrate 3 included in the droplet discharging head 100 will be described with reference to FIGS. 5A to 6E. Note that an example of the manufacturing step of the cavity substrate 3 will be described below, and the manufacturing step is not limited to this. While the component of droplet discharging head 100 is simultaneously formed in a plurality of numbers on a wafer by wafer basis in practice, only a part of them is shown in FIGS. 5A to 6E. FIGS. 5A to 6E are longitudinal sectional views taken along the line A-A (shown in FIG. 1) of the electrode substrate 4 and the cavity substrate 3, both of which are assembled. Note that FIGS. 6A to 6E are sectional views taken along the line B-B of the electrode substrate 4 and the cavity substrate 3, both of which are assembled.

A silicon substrate 3*a* having a face direction (110), which will be processed to be the cavity substrate 3, is prepared. The surface, which will be bonded to the electrode substrate 4, of the silicon substrate 3*a* is mirror polished to a thickness of 140 μm. The silicon substrate 3*a* is set to a quartz boat so that a surface, to which a boron diffused layer 81 is formed, of the silicon substrate 3*a* faces a solid diffusion source mainly composed of $B_2O_3$. The boron diffused layer 81 becomes the vibration plate 8. Then, the quartz boat is set inside a vertical type furnace. Nitrogen is introduced and kept inside the furnace. The silicon substrate 3*a* is heated at 1050° C. and kept for 7 hours in the nitrogen atmosphere so as to diffuse boron into one side surface of the silicon substrate 3*a* to form the boron diffused layer 81 (refer to FIG. 5A).

In the step for forming the boron diffused layer 81, the silicon substrate 3*a* (and the quartz boat) is put in the furnace at 800° C., and is taken out from the furnace at 800° C. This process allows the silicon substrate 3*a* to quickly pass through a region (600° C. to 800° C.), in which oxygen defects due to oxygen contained in the silicon substrate 3*a* grow rapidly. As a result, the occurrence of oxygen defects can be suppressed. In the process, a boron compound (not shown) is formed on the surface of the boron diffused layer 81. The boron compound, however, can be chemically changed into $B_2O_3$ and $SiO_2$, both of which can be etched by an aqueous hydrofluoric acid solution, by oxidizing in oxygen and a moisture vapor atmosphere at 600° C. for one and half hours. Then, film of $B_2O_3$ and $SiO_2$ of the boron diffused area is etched and removed by soaking the silicon substrate 3*a* in the aqueous hydrofluoric acid solution for 10 minutes.

Subsequently, an $SiO_2$ film 82 is formed by TEOS-CVD, thermal oxidizing, or the like in order to form a first recess 24*a*, which will be processed to be the through hole 24, and the second recess 13*a* to the surface, on which the boron diffused layer 81 has been formed, of the silicon substrate 3*a*. When the $SiO_2$ film 82 having a thickness of 0.1 μm is formed by using TEOS, the processing conditions are as follows: processing temperature is 360° C.; high frequency output is 250 W; pressure is 66.7 Pa (0.5 Torr); TEOS flow rate is 100 $cm^3$/min. (100 sccm); and oxygen flow rate is 1000 $cm^3$/min. (1000 sccm).

The surface of the $SiO_2$ film 82 is coated with a resist (not shown). The resist is patterned for forming the first recess 24*a*, which becomes the through hole 24, and the second recess 13*a*, which corresponds to the FPC mount area 13, to the silicon substrate 3*a*. Simultaneously, the sealing hole 14*a* to form the sealing part 14 may be formed. Then, the $SiO_2$ film 82 is patterned by wet etching with an aqueous hydrofluoric acid solution. Then, the resist is totally removed (refer to FIG. 5B).

Figure 5A:
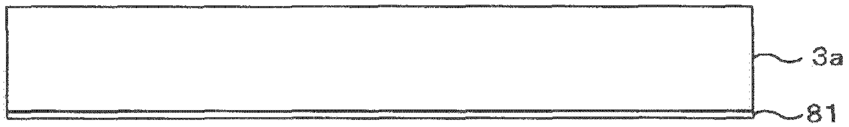
FIGS. 5A to 5E are longitudinal sectional views exemplarily illustrating a manufacturing step of a cavity substrate.
Figure 5B:
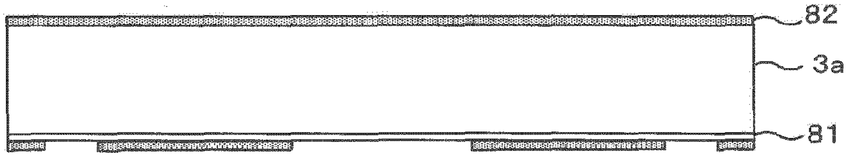
Figure 5C:
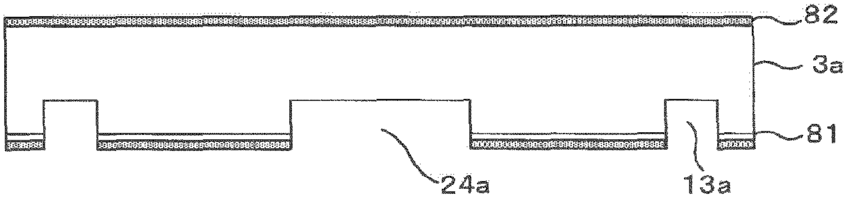
Figure 5D:
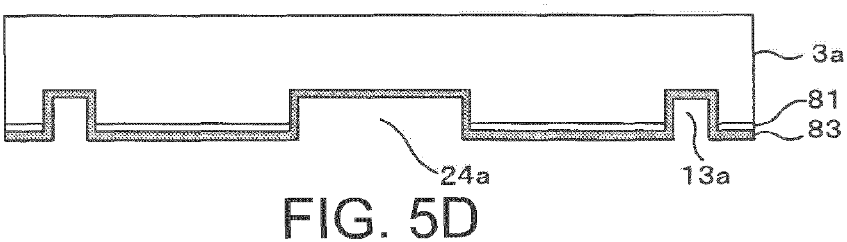
Figure 5E:
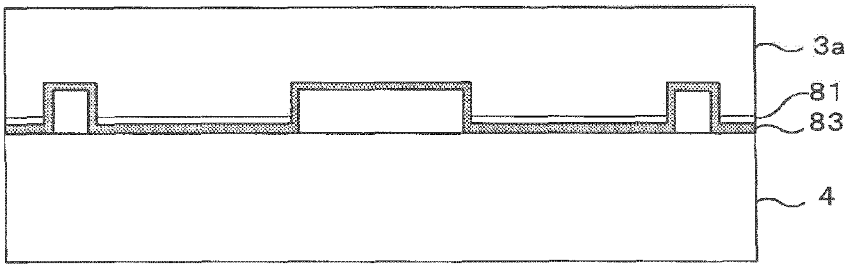

Using the $SiO_2$ film 82 as a mask, the first recess 24*a*, which becomes the through hole 24 in which the driver IC 15 is mounted, and the second recess 13*a*, which corresponds to the FPC mount area 13, are formed to have a depth of about 40 μm by dry etching (anisotropic dry etching) such as inductively coupled plasma (ICP) and reactive ion etching (RIE) (refer to FIG. 5C). When RIE is used, the above recesses are formed by applying plasma to a desired area with a silicon mask for about 60 minutes. The process conditions are as follows: RF power is 200 W; pressure is 40 Pa (0.3 Torr); and $CF_4$ flow rate is 30 $cm^3$/min (30 sccm). The depths of the first recess 24*a* and the second recess 13*a* are larger than the thickness of the cavity substrate 3.

Next, the $SiO_2$ film 82 is totally removed by an aqueous hydrofluoric acid solution. The $SiO_2$ film 82 is formed again on the surface on which the boron diffused layer 81 is formed with a thickness of about 100 nm by TEOS-CVD or the like (refer to FIG. 5D). After the first recess 24*a* and the second recess 13*a* are formed on the silicon substrate 3*a*, the silicon substrate 3*a* is aligned and anodic bonded to the electrode substrate 4, on which a pattern of the individual electrode 17 and the ink supply hole 11 have been formed (refer to FIG. 5E). This anodic bonding is conducted as the following steps: the silicon substrate 3*a* and the electrode substrate 4 are heated at 360° C.; the electrode substrate 4 is connected to an negative pole while the silicon substrate 3*a* is connected to a positive pole; and a voltage of 800 V is applied. As a result, the silicon substrate 3*a* and the electrode substrate 4 are bonded at the atomic level.

Figure 6A:
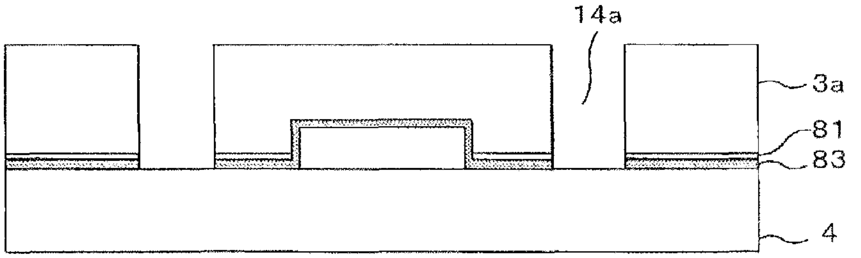
FIGS. 6A to 6E are longitudinal sectional views exemplarily illustrating a manufacturing step of the cavity substrate.

After the silicon substrate 3*a* and the electrode substrate 4 are anodic bonded, the sealing hole 14*a* for forming the sealing part 14 is formed (refer to FIG. 6A). The sealing hole 14*a* is formed as follows: an $SiO_2$ film (not shown) is formed on the surface of the silicon substrate 3*a* by TEOS-CVD or the like, and then the $SiO_2$ film on a part corresponding to the sealing hole 14*a* is dry etched by using a resist (not shown). The thickness of the $SiO_2$ film is determined depending on the selection ratio of etching gas in dry etching. Specifically, the resist is patterned, and then the resist on a part corresponding to the sealing hole 14*a* is removed by an aqueous hydrofluoric acid solution. Subsequently, the sealing hole 14*a* is formed by ICP or RIE dry etching so as to penetrate the silicon substrate 3*a*.

Figure 6B:
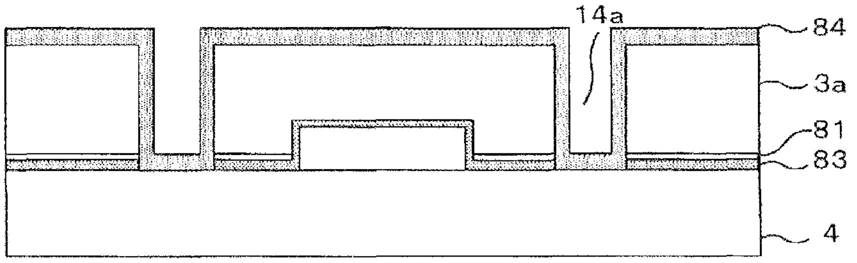
Figure 6C:
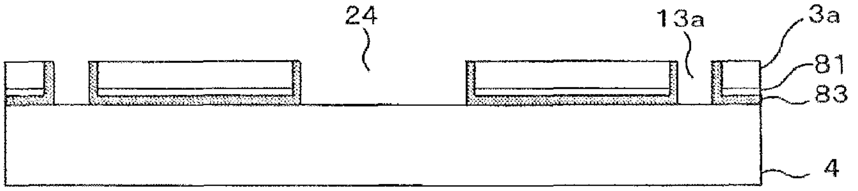

After the sealing hole 14*a* penetrates the silicon substrate 3*a*, an $SiO_2$ film 84 is formed on the entire surface of the silicon substrate 3*a* with a thickness of about 3 μm by TEOS-CVD or the like (refer to FIG. 6B). In this step, the $SiO_2$ film 84 is formed inside the sealing hole 14*a* to serve as the sealing part 14. Then, the silicon substrate 3*a* is lapped and polished to a predetermined thickness (in this case, e.g. about 35 μm) (refer to FIG. 6C). In the step, the first recess 24*a* and the second recess 13*a* are opened. That is, the first recess 24*a* is opened to form the through hole 24.

Figure 6D:
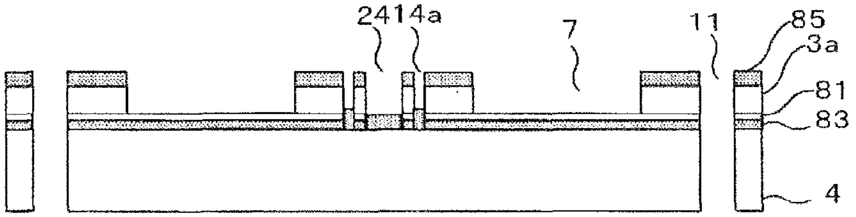

Then, flow paths for a droplet such as ink are formed on the silicon substrate 3*a* (refer to FIG. 6D). Next, an $SiO_2$ film 85 is formed on the entire surface of the silicon substrate 3*a* with a thickness of about 10 nm by TEOS-CVD or the like. Simultaneously, the $SiO_2$ film 85 is formed inside the through hole 24 and the second recess 13*a*. The thickness of the $SiO_2$ film 85 is determined depending on the selection ratio of an etchant used in etching the silicon substrate 3*a* in later step. That is, the thickness is set so that the $SiO_2$ film 85 can withstand an etchant (e.g. an aqueous KOH solution) used. The thickness of the $SiO_2$ film 85 is also set so as not to exceed that of the $SiO_2$ film 83 formed on the side surface of a part formed to the silicon substrate 3*a* as an opening. Thus, the etchant needs to be examined (e.g. the selection ratio is improved by adding Ca or the like).

After the $SiO_2$ film 85 is formed, a resist (not shown) is coated by spraying. Then, the $SiO_2$ film 85 is patterned. The silicon substrate 3*a* is etched by using an aqueous KOH solution after the resist is removed. As a result, flow paths such as the ink supply hole 11 and the discharge chamber 7 are formed. Next, the $SiO_2$ film 85 formed inside the through hole 24 and the second recess 13*a*, corresponding to the FPC mount area 13, with a thickness of about 10 nm is removed by RIE etching or the like. The $SiO_2$ film 85 remaining on the surface of the silicon substrate 3*a* may be simultaneously removed.

Figure 6E:
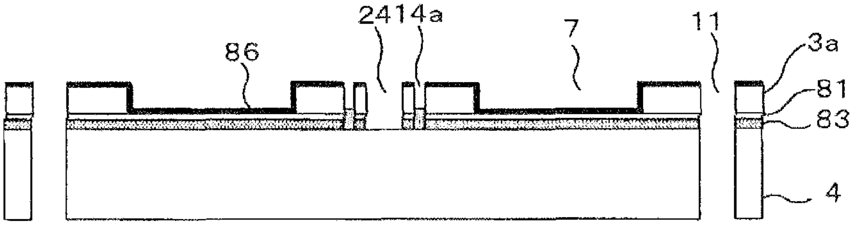
Figure 6F:
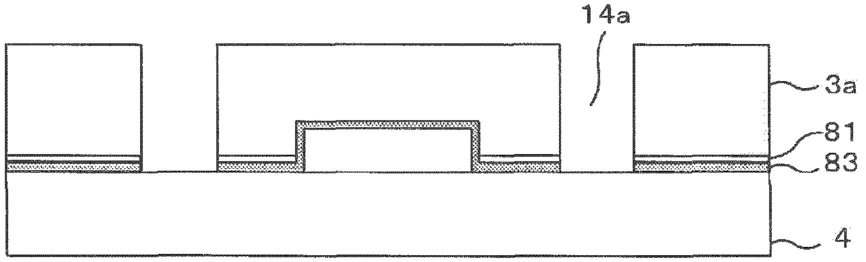
Figure 6G:
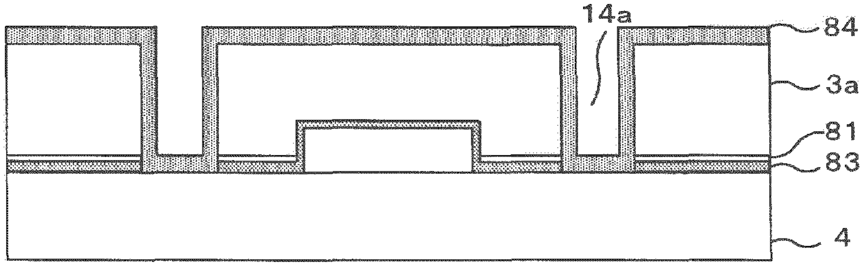
Figure 6H:
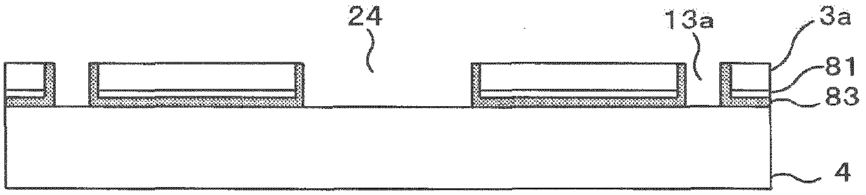
Figure 6I:
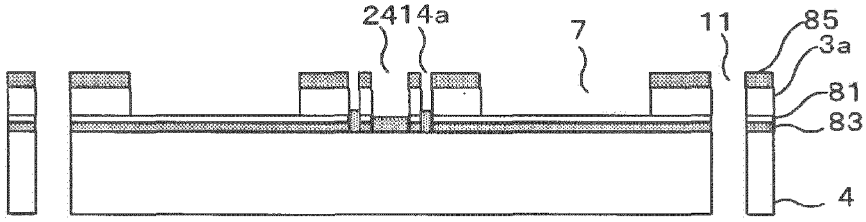
Figure 6J:
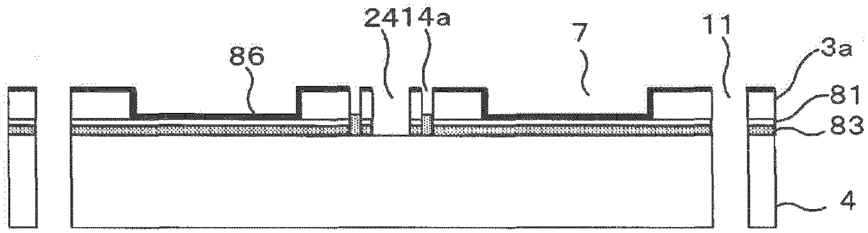

Then, an ink protective film 86 (e.g. $SiO_2$ film) is formed with a thickness of about 100 nm by TEOS-CVD or the like with a silicon mask (not shown) having an opening corresponding to only a flow path of the silicon substrate 3*a* (refer to FIG. 6E). Through the above steps, the cavity substrate 3*a* is achieved. Subsequently, the reservoir substrate 2, which has been made in other steps in advance, is bonded to the cavity substrate 3 with an epoxy adhesive, for example. The driver IC 15 is mounted inside the storing space 26 with an anisotropic conductive adhesive. Likewise, the nozzle substrate 1, which has been made in other steps, is bonded to the reservoir substrate 2, which has been bonded, with an epoxy adhesive, for example. The bonded substrates are diced along a dicing line to be singulated into the droplet discharging head 100. As a result, the droplet discharging head 100 is completed.

In the droplet discharging head 100 manufactured as described above, the cavity substrate 3 has no part in which silicon is exposed, particularly on the wall faces of the through hole 24 and the second recess 13*a*, allowing the input wiring line 20 formed on the electrode substrate 4 and silicon to be prevented from being electrically shorted. As a result, the input wiring line 20 formed on the electrode substrate 4 is free from unnecessary electrical damages. That is, the droplet discharging head 100 can be effectively prevented from electrical failures without having a complicated structure.

In the embodiment, the droplet discharging head 100 is exemplarily described that includes the electrode substrate 4, the cavity substrate 3, the reservoir substrate 2 and the nozzle substrate 1. The structure, however, is not limited to this. For example, a droplet discharging head may be applicable in which three substrates are layered, on one of which the discharge chamber 7 and the reservoir 10 are formed. The manufacturing step of the droplet discharging head 100 is exemplarily described. The conditions such as temperature, pressure, time, and thickness are not limited to those described above.

Figure 7:
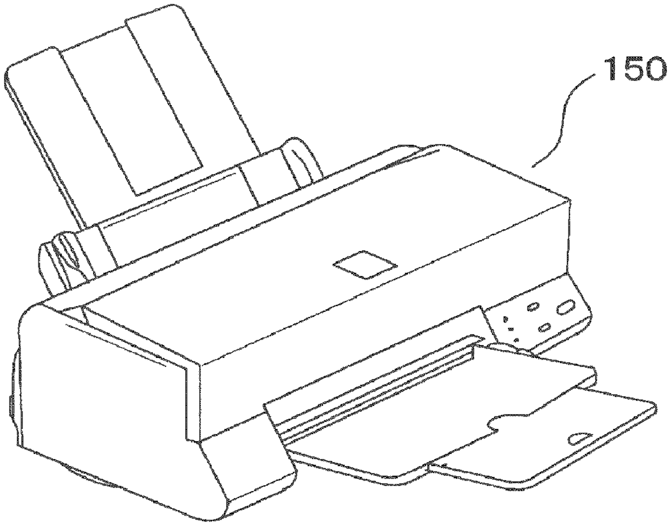
FIG. 7 is a perspective view of exemplarily illustrating the droplet discharging device provided with the droplet discharging head.

FIG. 7 is a perspective view of exemplarily illustrating a droplet discharging device 150 provided with the droplet discharging head 100. The droplet discharging device 150 shown in FIG. 7 is a typical inkjet printer. The droplet discharging device 150 can be manufactured by known manufacturing methods. The droplet discharging head 100 can be applied to manufacturing color filters of liquid crystal displays, forming luminescent parts of organic EL displays, and discharging biological liquid by using various droplets in addition to the droplet discharging device 150 shown in FIG. 7.

When liquid is discharged to a substrate serving as a biomolecule microarray by using the droplet discharging head 100 as a dispenser, liquid may be discharged that contains a probe such as deoxyribo nucleic acids (DNA), other nucleic acids such as ribo nucleic acids and peptide nucleic acids, and other proteins.

The droplet discharging head, the method for manufacturing the same, the droplet discharging device, and the method for manufacturing the same according to the embodiment of the invention are not limited to the contents described in the embodiment, but they may be modified without departing from the spirit and scope of the invention. For example, the selection ratio of an etchant used for wet etching and the selection ratio of etching gas used for dry etching may be changed depending on the etching depth, the thickness of etched material or the like.

What is claimed is:

1. A droplet discharging head, comprising:

a cavity substrate including a discharge chamber having a bottom wall serving as a vibration plate; and an electrode substrate including:

an individual electrode that faces the vibration plate with a gap and drives the vibration plate; and a driver integrated circuit (IC) that couples with the individual electrode and applies a voltage to the individual electrode, wherein the cavity substrate includes:

a first opening that penetrates the cavity substrate so as to expose a surface of the electrode substrate and which serves to house the driver IC; and an insulation film formed at least on a rim of the first opening and without extending into the first opening.

2. The droplet discharging head according to claim 1, wherein the electrode substrate includes a flexible printed circuit (FPC) mount area on which a flexible printed board to supply a signal for driving the individual electrode, and the cavity substrate includes a second opening corresponding to the FPC mount area, and the insulation film formed on a wall face of the second opening.

3. The droplet discharging head according to claim 1, wherein the cavity substrate includes a sealing hole sealed with a sealant to form a sealing part for shielding the gap from ambient air and the insulation film formed on a wall face of the sealing hole.

4. The droplet discharging head according to claim 1, wherein the insulation film is a silicon oxide film.

5. A droplet discharging device, comprising the droplet discharging head according to claim 1.

6. A method for manufacturing a droplet discharging head, comprising:

forming a first recess and a second recess on a surface of a silicon substrate;

forming an insulation film on the surface;

anodic bonding the silicon substrate to an electrode substrate; and forming a liquid flow path to the silicon substrate, wherein the silicon substrate includes a discharge chamber having a bottom wall serving as a vibration plate and the liquid flow path communicating with the discharge chamber, and the electrode substrate includes an individual electrode that faces the vibration plate with a gap and drives the vibration plate, and the first recess that houses a driver integrated circuit (IC) that is mounted on the electrode substrate and couples to the individual electrode and supplies a voltage to the individual electrode, and the second recess corresponds to a flexible printed circuit (FPC) mount area that is formed on the electrode substrate and on which a flexible printed board is mounted to supply a signal for driving the individual electrode, wherein the insulation film is formed at least on a rim of the first recess and not extending into an opening defined by the first recess.

7. The method for manufacturing a droplet discharging head according to claim 6, further comprising, after anodic bonding the silicon substrate and the electrode substrate, forming a sealing hole for being sealed with a sealant to form a sealing part shielding the gap from ambient air.

8. The method for manufacturing a droplet discharging head according to claim 7, further comprising sealing the sealing hole, and thereafter polishing the silicon substrate to a predetermined thickness to form the first and second recesses as through holes.

9. The method for manufacturing a droplet discharging head according to claim 8, further comprising, after forming the first and second recesses as through holes and before forming the liquid flow path, forming an insulation film on a surface of the silicon substrate.

10. A method for manufacturing a droplet discharging device, comprising the method for manufacturing a droplet discharging head according to claim 6.

* * * * *